United States Patent [19]  [11]  4,446,266
von Gentzkow et al.  [45]  May 1, 1984

[54] N,N'-BIS-SALICYLOYL-HYDRAZINE AS A METAL DEACTIVATOR

[75] Inventors: Wolfgang von Gentzkow, Kleinsendelbach; Roland Rubner, Röttenbach, both of Fed. Rep. of Germany

[73] Assignee: Siemens Aktiengesellschaft, Munich, Fed. Rep. of Germany

[21] Appl. No.: 173,409

[22] Filed: Jul. 29, 1980

[30] Foreign Application Priority Data

Aug. 21, 1979 [DE] Fed. Rep. of Germany ....... 2833870

[51] Int. Cl.$^3$ ............................................... C08K 5/25
[52] U.S. Cl. .................................................. 524/193
[58] Field of Search ................ 260/45.9 NC; 564/150; 524/193

[56] References Cited

U.S. PATENT DOCUMENTS 3,734,885  5/1973  Muller et al. ............... 260/45.9 NC
3,761,519  9/1973  Meek .............................. 260/559 H
3,993,622  11/1976  Brunetti ..................... 260/45.9 NC Primary Examiner—V. P. Hoke
Attorney, Agent, or Firm—Kenyon & Kenyon

[57] ABSTRACT

The invention relates to the use of N,N'-bis-salicyloyl hydrazine as a metal deactivator for organic materials which are in contact with copper or contain copper or copper ions, and has the object of providing an N,N'-bis-salicyloyl hydrazine which allows processing without danger on an industrial scale. For this purpose, the invention provides an N,N'-bis-salicyloyl hydrazine which is prepared from salicylic-acid alkyl ester and either hydrazine or salicylic-acid hydrazide. N,N'-bis-salicyloyl hydrazine prepared in this manner serves particularly as a metal deactivator in cable and wire insulation for power and communications engineering.

3 Claims, No Drawings

N,N'-BIS-SALICYLOYL-HYDRAZINE AS A METAL DEACTIVATOR

BACKGROUND OF THE INVENTION

The present invention relates to the use of N,N'-bis-salicyloyl-hydrazine as a metal deactivator for organic materials which are in contact with copper or contain copper or copper ions.

Many organic materials which currently are used in electrical technology for insulation purposes, for example, polymers such as polyoxymethylene, polyamide and unsaturated polyester resins, and particularly polymers such as polyolefins, are subject to accelerated thermo-oxidative aging in the presence of copper. This disadvantageous property considerably impairs the electrical and mechanical properties of these materials in long-term use. The detrimental effect of copper on these materials is particularly aggravated at elevated temperatures since the aging rate of the polymers increases steeply with increasing temperatures.

Cross-linked polyolefins, which are used increasingly as insulating material for cables and wires, are subject to greatly accelerated aging in the presence of copper and must, therefore, be protected effectively against the oxidation-accelerating influence of copper. According to experience, this can be done by placing a foil as a separating layer between the copper conductor and the insulation or by using tinned conductors, thereby avoiding direct contact of the copper with the insulation. Such measures, however, are expensive and very demanding from a manufacturing point of view. Thus, if a foil is used as a separating layer, only low production rates are possible, particularly with small conductor cross sections.

Another approach for meeting the desired requirements as to quality and allowable temperature stress of polymer materials in contact with copper is the use of so-called "copper deactivators" which inhibit the oxidation-accelerating effect of copper at elevated temperatures. Stabilizing polymer materials through the use of copper deactivators is therefore a cost-effective measure.

It is known from U.S. Pat. No. 3,849,492 to use metal deactivators of the N,N'-bis-salicyloyl hydrazine type for this purpose. In this connection, multiple alkyl-or alkoxy-substituted derivatives of the base compound are said, in particular, to be effective for stabilizing polyolefins against the deleterious effect of copper and other transition metals.

From German Pat. No. 27 03 558, it is known (see column 2, lines 49 to 65) that for durable stabilization of polymers in contact with copper, a combination of N,N'-bis-salicyloyl hydrazine as a metal deactivator and oligomeric 2,2,4-trimethyl-1,2-dihydroquinoline as an oxidation inhibitor is commercially advantageous. This stabilizer combination also has been found to be particularly effective for stabilizing cross-linked polyolefins. The effectiveness of the unsubstituted N,N'-bis-salicyloyl hydrazine as a metal deactivator was determined on the basis of extensive investigations on model conductors and from aging tests on commercial products.

In the mentioned stabilizer combination, the product serving as the metal deactivator was obtained directly through reaction of commercial-grade salicylic acid hydrazide with commercial-grade salicylic acid with the addition of commercial-grade thionyl chloride and pyridine in commercial-grade chlorobenzene, and was present, after purification by washing with alcohol, with a purity of 99% (see also British Pat. No. 1 398 360).

A metal deactivator of the type mentioned and other additives in a polymer material such as a polyolefin for wire and cable insulation are worked-in on a commercial scale by conventional mixing methods. In cable and wire technology, it is preferred that so-called "concentrates", consisting of a metal deactivator or other additives and polymer material, are prepared first. The concentrates are then processed into insulating mixtures with the desired concentrations of metal deactivator and the further additives by mixing them into further polymer material.

In the manufacture of the concentrates with the metal deactivator prepared in this manner on a commercial scale it has been found that eye irritation or damage can occur in persons concerned therewith. These eye irritations or damage could be traced to the metal deactivator used.

To avoid eye irritation or damage, it has, therefore, been attempted to use as a metal deactivator an N,N'-bis-salicyloyl hydrazine which is prepared by known methods from salicylic-acid chloride and hydrazine or from salicylic-acid chloride and salicylic-acid hydrazide, which is purified by recrystallization, and in which the mass content of chlorine is $\leq 0.002\%$, the mass content of sulfur is $\leq 0.07\%$ and the overall acidity (monobasic acid) is $\leq 0.4$ mmol/kg. These maximally permissible impurity contents were determined by animal tests in which extracts of N,N'-bis-salicyloyl hydrazine products of different purities in isotonic common-salt solution were applied to rabbits over a period of 3 weeks (test method 1), on the assumption that only the components soluble in the body fluid have a harmful effect.

With a modified, drastically intensified test method (test method 2), in which the solid substance in question repeatedly was placed directly in the eye of test animals (rabbits) at relatively short time intervals, i.e., days, heavy irritation was found in the case of such a product. This test method, which also was carried out in the following context under intensified conditions, assumes that the metal deactivator in solid form, for example, as dust, can get into the eye.

SUMMARY OF THE INVENTION

It is an object of the invention to provide, for use as a metal deactivator for organic materials which are in contact with copper or contain copper or copper ions, an N,N'-bis-salicyloyl hydrazine which allows non-hazardous processing in engineering applications due to substantially reduced eye irritation.

According to the invention, this and other objects are achieved by utilizing an N,N'-bis-salicyloyl hydrazine which is prepared from salicylic-acid alkyl ester and hydrazine or from salicylic-acid alkyl ester and salicylic-acid hydrazide, optionally in the presence of a catalyst.

Surprisingly, it has been found that, as determined relative to the mentioned test method 2, eye irritation or damage occurs in greatly reduced form if an N,N'-bis-salicyloyl hydrazine is used which is obtained by reaction of salicylic-acid alkyl ester with either hydrazine or salicylic-acid hydrazide. The reaction, in which no salicylic-acid chloride is used, can be accelerated by nucleophilic and/or electrophilic catalysts, nucleophilic catalysis being preferred. In particular, useful catalysts include primary, secondary or tertiary amines as well as amino group-containing compounds such as, for example, nitrogen-containing heterocycles, amides and hydrazides, or the ammonium salts of these amines and amino group-containing compounds with inorganic or organic acids. The raw product produced in the reaction can optionally be processed further by conventional purification methods such as recrystallization.

The metal deactivator according to the present invention is used to particular advantage in a mixture with customary phenolic or aminic oxidation inhibitors for stabilizing organic materials, particularly plastics and plastic precursors, against oxidative decomposition. A particularly synergistic effect is obtained with a mixture of the metal deactivator with oligomeric 2,2,4-trimethyl-1,2-dihydroquinoline. The metal deactivator according to the present invention may be processed by the customary mixing techniques, for example, via concentrates, and particularly by direct dosing of a metal deactivator that is adjusted for optimum processing by suitable liquid additives.

According to the present invention, cross-linked and non-cross-linked thermoplastics such as cross-linked and non-cross-linked polyolefins, and elastomers as well as reaction resins in hardened and unhardened condition may, in particular, advantageously be protected against detrimental catalytic influences of copper. Polymers which contain the metal deactivator according to this invention can be used to particular advantage as cable and wire insulation in power and communication engineering. In addition, the metal deactivator according to the present invention may also be used for stabilizing polymer materials, insulating oils and lubricating greases which are in contact with copper or contain copper ions and which are of particular use in electrical engineering applications.

DETAILED DESCRIPTION OF THE INVENTION

The invention is explained in still further detail in the following section.

N,N'-bis-salicyloyl hydrazine with reduced eye-irritating effect is prepared, for example, as follows:

(a) Salicylic-acid hydrazide is heated in an excess of salicylic-acid alkyl ester and in the presence of catalytic amounts of a primary, secondary or tertiary amine, an amino group-containing compound or an ammonium salt of an amine or an amino group-containing compound, until a maximum amount of the N,N'-bis-salicyloyl hydrazine is precipitated. After the substance has cooled, it is evacuated, washed with alcohol and dried. If necessary, it can be purified further through recrystallization.

(b) Hydrazine hydrate is heated in an excess of salicylic-acid alkyl ester and in the presence of catalytic amounts of a primary, secondary or tertiary amine, an amino group-containing compound or an ammonium salt of an amine or an amino group-containing compound until a maximum amount of N,N'-bis-salicyloyl hydrazine is precipitated. After it has cooled, the substance is evacuated, washed with alcohol and dried. If required, it can be purified by recrystallization.

The eye-irritating effect of the N,N'-bis-salicyloyl hydrazine was tested in accordance with the so-called test method 2 referred to earlier. In each test series, 0.1 g of substance was applied daily for 5 days to six rabbits in the conjunctiva sack of the right eye of each rabbit. In three of the respective six test animals of a test series, the conjunctiva sack was rinsed out after 1 hour with physiological salt solution, taking care that the substance was removed completely. The remaining three test animals of the same test series were not treated further.

In these investigations, it was found that in the rabbits treated with the metal deactivator prepared according to the earlier-described method using salicylic-acid chloride, and which was purified by recrystallization, there occurs, besides heavy reddening of the conjunctiva, a heavy clouding of the cornea which recedes in the course of three weeks after the last application, but very slowly. With N,N'-bis-salicyloyl hydrazine according to the present invention, on the other hand, only a temporary, relatively slight reddening of the conjunctiva and a comparitively slight clouding of the cornea occur. If the product according to the present invention is used, a distinct improvement, i.e., a greatly reduced irritation effect, is therefore obtained.

What is claimed is:

1. In a method for stabilizing organic materials in contact with or containing copper or copper ions by including therein a metal deactivator, the improvement comprising utilizing as said metal deactivator N,N'-bis-salicyloyl hydrazine prepared by the reaction of a salicylic-acid alkyl ester and a compound selected from the group consisting of hydrazine and salicylic-acid hydrazide.

2. The method according to claim 1 wherein said organic material comprises a polymer.

3. The method according to claim 2 wherein said polymer is selected from the group consisting of reaction resins, elastomers and cross-linked polyolefins.

* * * * *